United States Patent
Nakajima

Patent Number: 6,093,932
Date of Patent: Jul. 25, 2000

[54] METHOD OF WRITING ANY PATTERNS ON A RESIST BY AN ELECTRON BEAM EXPOSURE AND ELECTRON BEAM EXPOSURE SYSTEM

[75] Inventor: Ken Nakajima, Tokyo, Japan

[73] Assignee: NEC Corporation, Tokyo, Japan

[21] Appl. No.: 09/114,912

[22] Filed: Jul. 14, 1998

[30] Foreign Application Priority Data

Jul. 17, 1997 [JP] Japan ................................ 9-192519

[51] Int. Cl.[7] .............................. H01J 37/02; G21G 5/00
[52] U.S. Cl. ................................ 250/492.22; 250/492.23
[58] Field of Search .......................... 250/492.22, 492.23

[56] References Cited

U.S. PATENT DOCUMENTS

| | | | |
|---|---|---|---|
| 5,349,197 | 9/1994 | Sakamoto et al. | 250/492.22 |
| 5,371,373 | 12/1994 | Shibata et al. | 250/492.22 |
| 5,528,512 | 6/1996 | Moriyama | 250/492.22 |
| 5,703,376 | 12/1997 | Jensen | 250/492.22 |
| 5,876,902 | 3/1999 | Veneklasen et al. | 250/492.22 |

Primary Examiner—Bruce C. Anderson
Attorney, Agent, or Firm—Young & Thompson

[57] ABSTRACT

The present invention provides a method of writing at least a first pattern on a first region of a resist by a variable shaped electron beam exposure. The resist has at least a second region on which at least a second pattern is written by one-shot electron beam exposure. The second region is bounded by a boundary line with the first region so that the fist and second patterns are bounded by the boundary line with each other. The method comprises the steps of: setting a re-size amount; re-sizing a calibrated size of a variable shaped electron beam by a first amount which is smaller than the re-size amount; and shifting an origin for a shot of the variable shaped electron beam by a second amount which is substantially equal to a subtraction of the first amount from the re-size amount before a variable shaped electron beam shot is made.

10 Claims, 7 Drawing Sheets

A: Re-size amount

METHOD OF WRITING ANY PATTERNS ON A RESIST BY AN ELECTRON BEAM EXPOSURE AND ELECTRON BEAM EXPOSURE SYSTEM

BACKGROUND OF THE INVENTION

The present invention relates to a method of writing any fine patterns on a resist by an electron beam exposure and an electron beam exposure system.

In recent years, a high throughput has been required in manufacturing semiconductor devices, for example, in a lithography processes for writing fine patterns on a semiconductor wafer. The lithography may be classified into a photo-lithography using an ultraviolet ray, an X-ray lithography using an X-ray and an electron beam lithography using an electron beam. The electron beam lithography is carried out by use of a mask having a desired pattern. This electron beam lithography using the mask is often applied to regularly repeated patterns comprising a large number of repeated unit patterns, for example, memory cell patterns such as dynamic random access memory and static random access memory. In the meantime, a variable shaped electron beam exposure is applied to random patterns to form peripheral circuit regions.

FIG. 1 is a plane view illustrative of the regularly repeated patterns 11 formed in a first region 2 and the random patterns 4 formed in a second region 3. The regularly repeated patterns 11 and the random patterns 4 are bounded by pattern boundary portions 18. The regularly repeated patterns 11 are formed by an electron beam exposure using a mask. The random patterns 4 are formed by the variable shaped electron beam exposure. Prior to the variable shaped electron beam exposure, a pattern size calibration is conducted to decide a beam size of a variable shaped electron beam. Actually, however, there is an error on the beam size of the variable shaped electron beam. This error on the beam size of the variable shaped electron beam causes a dimensional variation or a size variation of the random pattern. This results in a difference in size or dimension of a resist between the regularly repeated patterns 19 and the random patterns 20. FIG. 2 is a fragmentary enlarged plane view illustrative of a difference in size or dimension of a resist between the regularly repeated patterns 19 and the random patterns 20 obtained after exposure and development.

In order to solve this problem, it is necessary to re-size the variable shaped electron beam so that the size of the random patterns 20 is reduced to correspond to the size of the regularly repeated patterns 19 in a direction along a boundary line between the individual pairs of the regularly repeated patterns 19 and the random patterns 20.

FIG. 3 is a fragmentary schematic view illustrative of a conventional variable shaped electron beam exposure system. The conventional variable shaped electron beam exposure system has an electron gun emitting an electron beam 22, a first aperture 23, a deflector 25 and a second aperture 24. The electron beam emitted from the electron gun is partially transmitted through the first aperture to shape the electron beam. This shaped electron beam is then deflected by the deflector 25 so that the shaped electron beam is partially transmitted through the second aperture to re-shape the electron beam. The shape of the electron beam having been transmitted through the second aperture 24 is variable by controlling the deflection by the deflector 25. As a result, a variable shaped electron beam 21 is obtained. FIG. 4 is a plane view illustrative of a relationship between a shape of the electron beam and the first and second apertures 23 and 24, wherein the electron beam is re-sized by a size shift amount 26. If the electron beam is re-sized by a size shift amount 26 by controlling the deflection by the deflector 25, then an origin 8 of a variable shaped electron beam shot remains fixed in position. FIG. 5 is a fragmentary enlarged plane view illustrative of the regularly repeated patterns 19 and the random 20 written by the resized variable shaped electron beam. The regularly repeated patterns 19 are formed in the first region such as memory cell region whilst the random patterns 20 are formed by the second region such as the peripheral region which is bounded by a boundary line 18 from the first region. The variable shaped electron beam is re-sized so that the individual random patterns 20 are re-sized by the size shift amount 26 but only on a first side 27 thereof, whilst a second side 28 opposite to the first side 27 remains fixed, wherein the origin of the variable shaped electron beam shot is on the second side 28. By adjusting the deflection of the electron beam by the deflector 25, it is possible to have the first side 27 of the individual random pattern 20 aligned to or correspond to the individual regularly repeated pattern 19. However, it is impossible for the above conventional method to have the second side 28 of the individual random pattern 20 aligned or correspond to the regularly repeated pattern 19. In order to have the second side 28 of the individual random pattern 20 aligned or correspond to the regularly repeated pattern 19, it is required to uniformly off-set on both sides of the individual random pattern 20 by utilizing overlay exposures. In this case, however, positioning relative to base patterns 7 depends upon individual patterns. This means that it is impossible to align the random patterns 20 to the regularly repeated patterns 19 in consideration of the random patterns 20 only. As a result, the accuracy of alignment is deteriorated.

If the above variable shaped electron beam exposure is applied to the formation of logic devices, then it is necessary to conduct calibrations in size of the variable shaped electron beam for every logic devices having different sizes. Further, it is also necessary to conduct a pilot writing for obtaining optimum exposure conditions to realize the desired pattern size of the resist. For these reasons, it takes a few hours to conduct the electron beam lithography.

In addition, a size shift from the design size appears in etching process. Thus, it is necessary to estimate the size shift in the etching process. This estimation is needed for every products or devices different in design size, base material, structure and thickness of layers or films. This results in a further extended time necessary for the electron beam lithography.

Moreover, the conventional variable shaped electron beam exposure system is engaged with a problem with deterioration in accuracy of the resist pattern size due to displacement of the paired first and second apertures and a variation in voltage applied to the deflector 25. If particularly contact patterns are written, rectangular-shaped fine patterns designed in accordance with fine design rules are written by the variable shaped electron beam. In this case, the variation in size of the resist pattern obtained becomes more remarkable.

In recent years, as having responded to the requirements for increase in variety of the logic devices and production in a small scale, it is required to shorten the time necessary for the manufacturing the logic devices. It is required to eliminate the process which provides a bar to shorten the time necessary for the manufacturing the logic devices.

As the integration of the devices and scaling down thereof have been promoting, there is needed, in a contact writing process applied with the minimum design rule, an extremely high accuracy in size of the resist pattern within a range of variation from −10% to +10% of the design size, for example, within 0.03 micrometers.

It is essential to solve the issue with deteriorated accuracy in size of the resist patterns written by the variable shaped electron beam exposure.

SUMMARY OF THE INVENTION

Accordingly, it is an object of the present invention to provide a novel method of writing patterns on a resist by a variable shaped electron beam exposure free from the above problems.

It is a further object of the present invention to provide a novel method of writing fine patterns with an extremely high accuracy in size on a resist by a re-sized variable shaped electron beam exposure.

It is a still further object of the present invention to provide a novel method of writing fine random patterns with an extremely high accuracy in size on a resist by a re-sized variable shaped electron beam exposure so that the fine random patterns are exactly aligned to regularly repeated patterns written by one-shot electron beam exposure using a mask.

It is yet a further object of the present invention to provide a novel variable shaped electron beam exposure system free from the above problems.

It is a further more object of the present invention to provide a novel variable shaped electron beam exposure system capable of writing fine patterns with an extremely high accuracy in size on a resist.

It is still more object of the present invention to provide a novel variable shaped electron beam exposure system capable of writing fine patterns with an extremely high accuracy in size on a resist so that the fine random patterns are exactly aligned to regularly repeated patterns written by one-shot electron beam exposure using a mask.

The present invention provides a method of writing at least a first pattern on a first region of a resist by a variable shaped electron beam exposure, the resist having at least a second region on which at least a second pattern is written by one-shot electron beam exposure. The second region is bounded by a boundary line with the first region so that the first and second patterns are bounded by the boundary line with each other. The method comprises the steps of setting a re-size amount; re-sizing a calibrated size of a variable shaped electron beam by a first amount which is smaller than the re-size amount; and shifting an origin for a shot of the variable shaped electron beam by a second amount which is substantially equal to a subtraction of the first amount from the re-size amount before a variable shaped electron beam shot is made.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
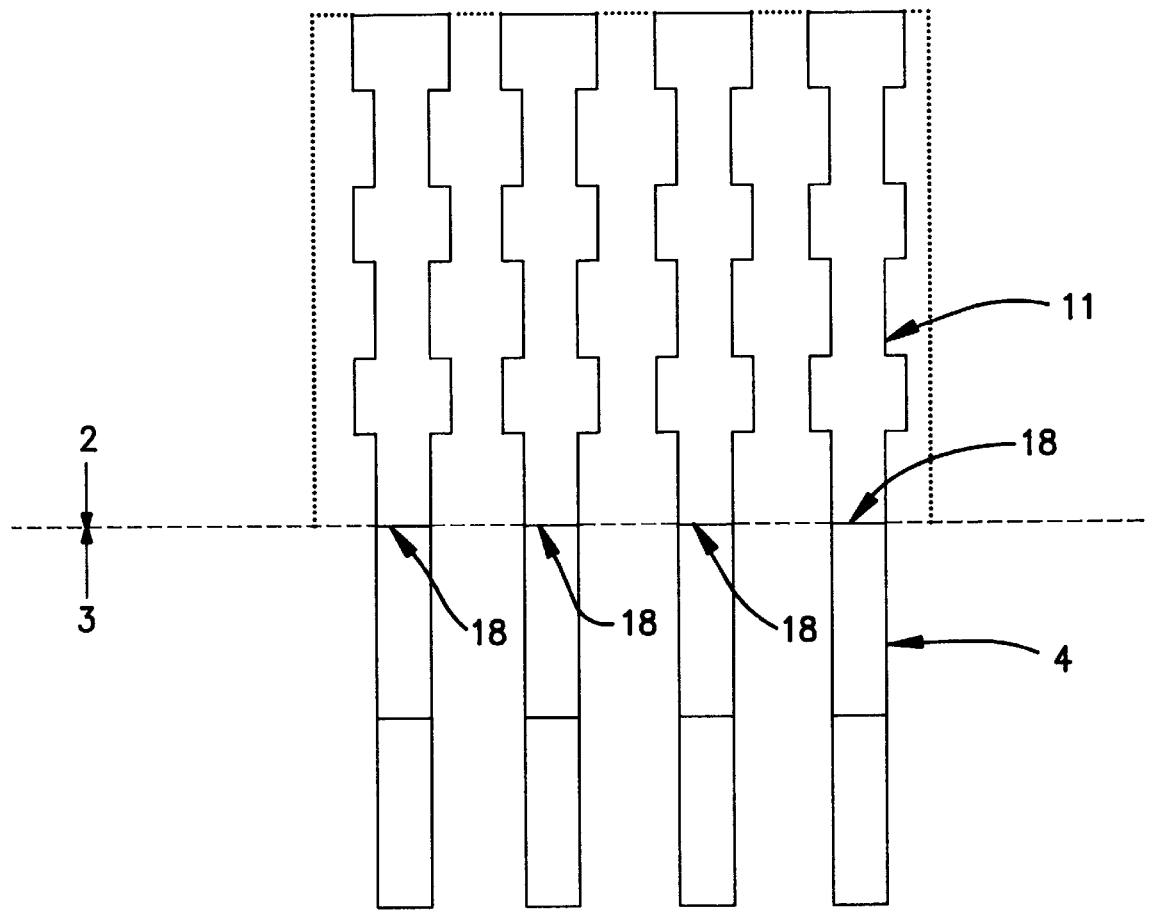
FIG. 1 is a plane view illustrative of the regularly repeated patterns formed in a first region and the random patterns formed in a second region.
Figure 2:
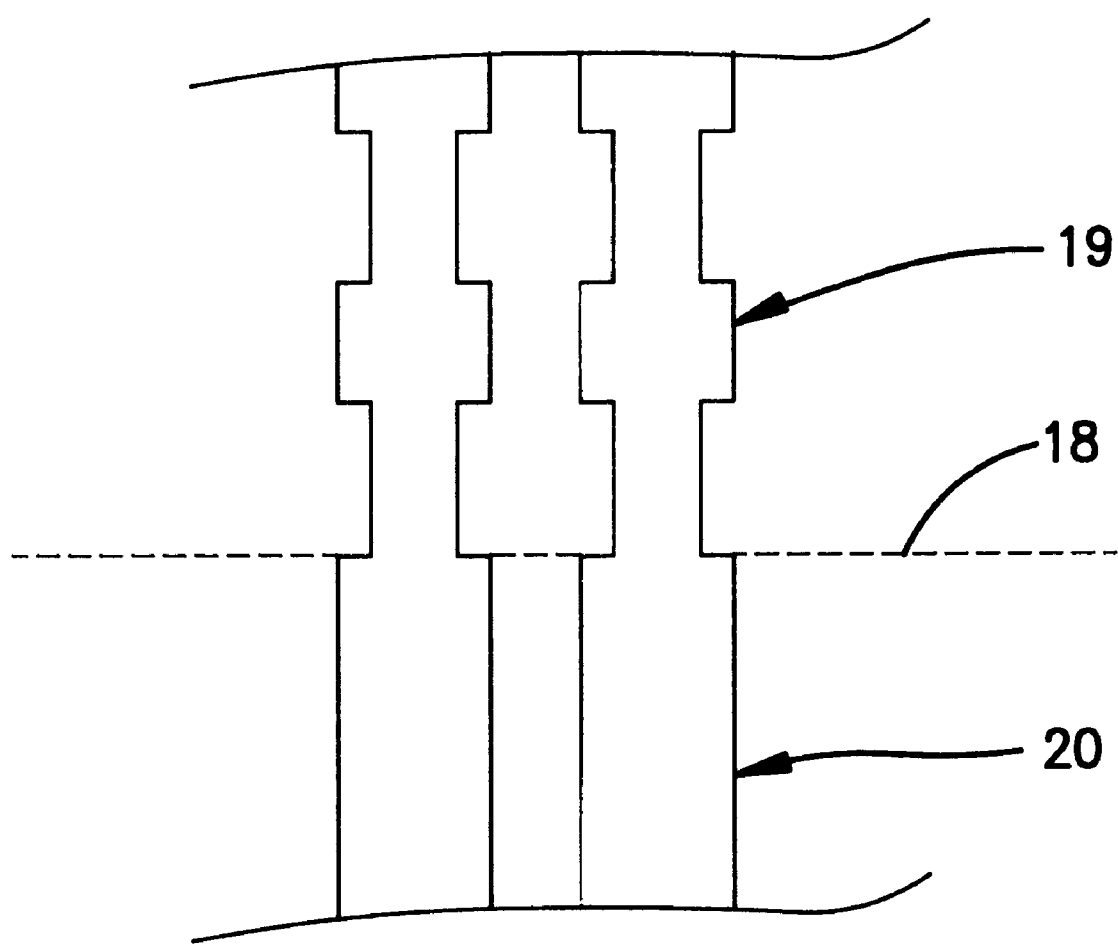
FIG. 2 is a fragmentary enlarged plane view illustrative of a difference in size or dimension of a resist between the regularly repeated patterns and the random patterns obtained after exposure and development.
Figure 3:
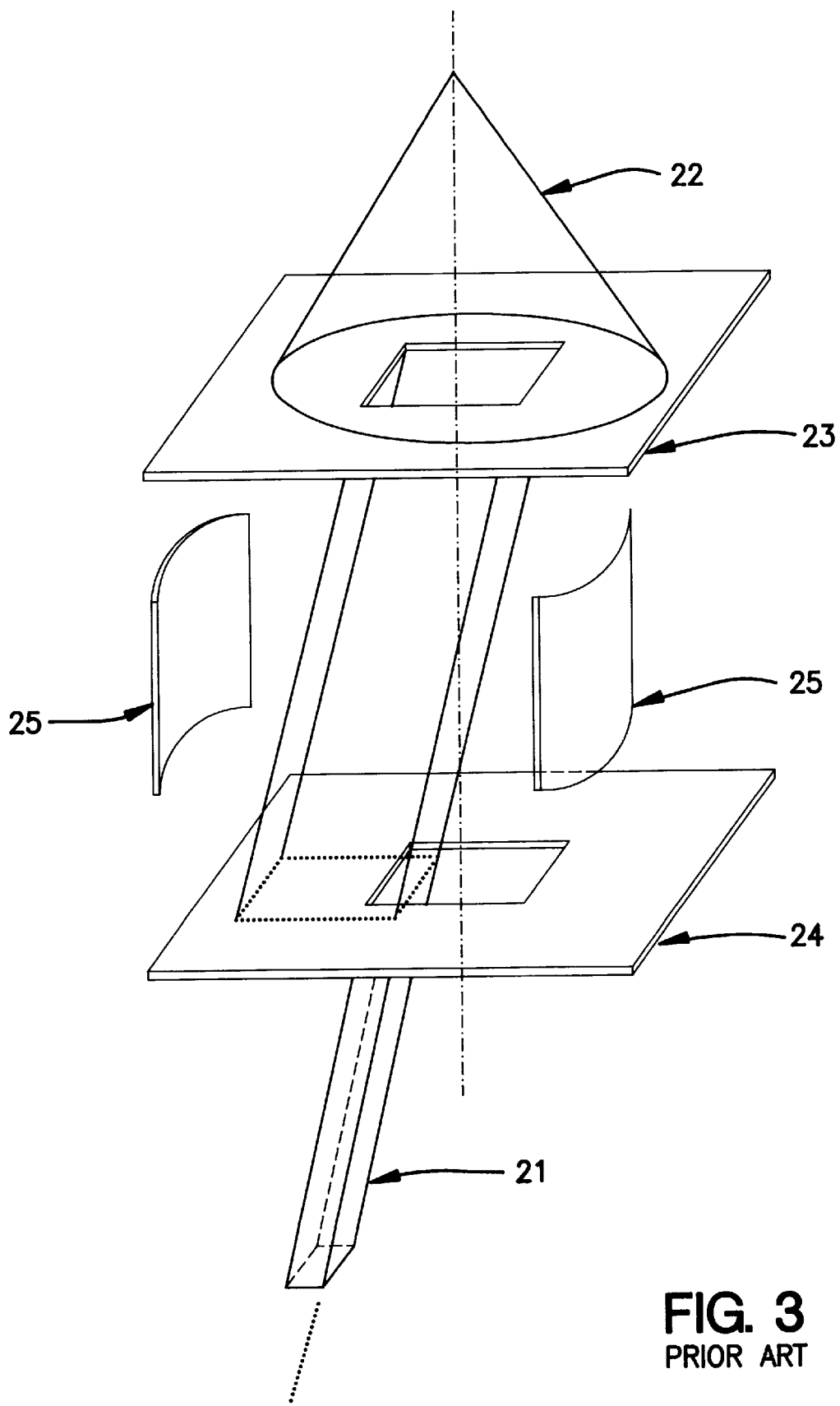
FIG. 3 is a fragmentary schematic view illustrative of a conventional variable shaped electron beam exposure system
Figure 4:
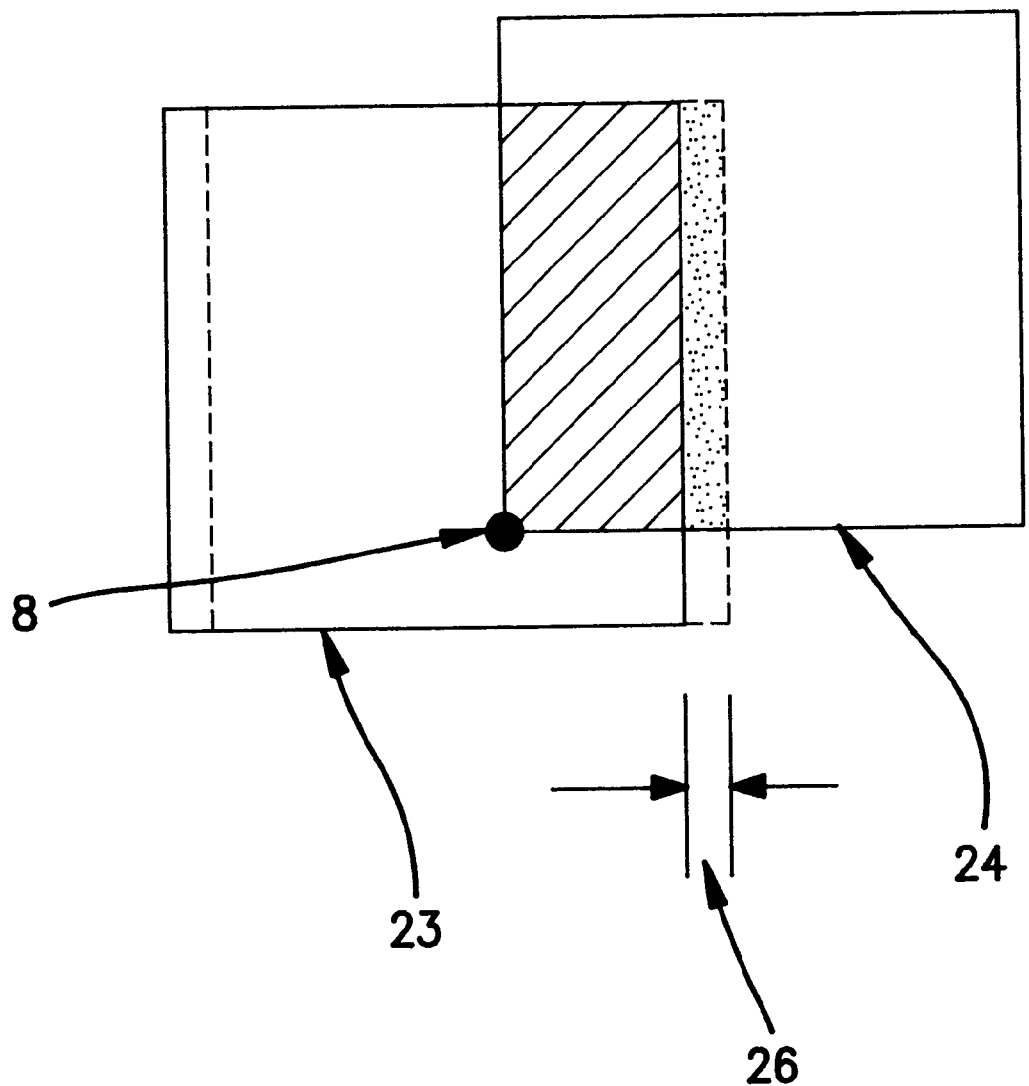
FIG. 4 is a plane view illustrative of a relationship between a shape of the electron beam and the first and second apertures, wherein the electron beam is re-sized by a size shift amount.
Figure 5:
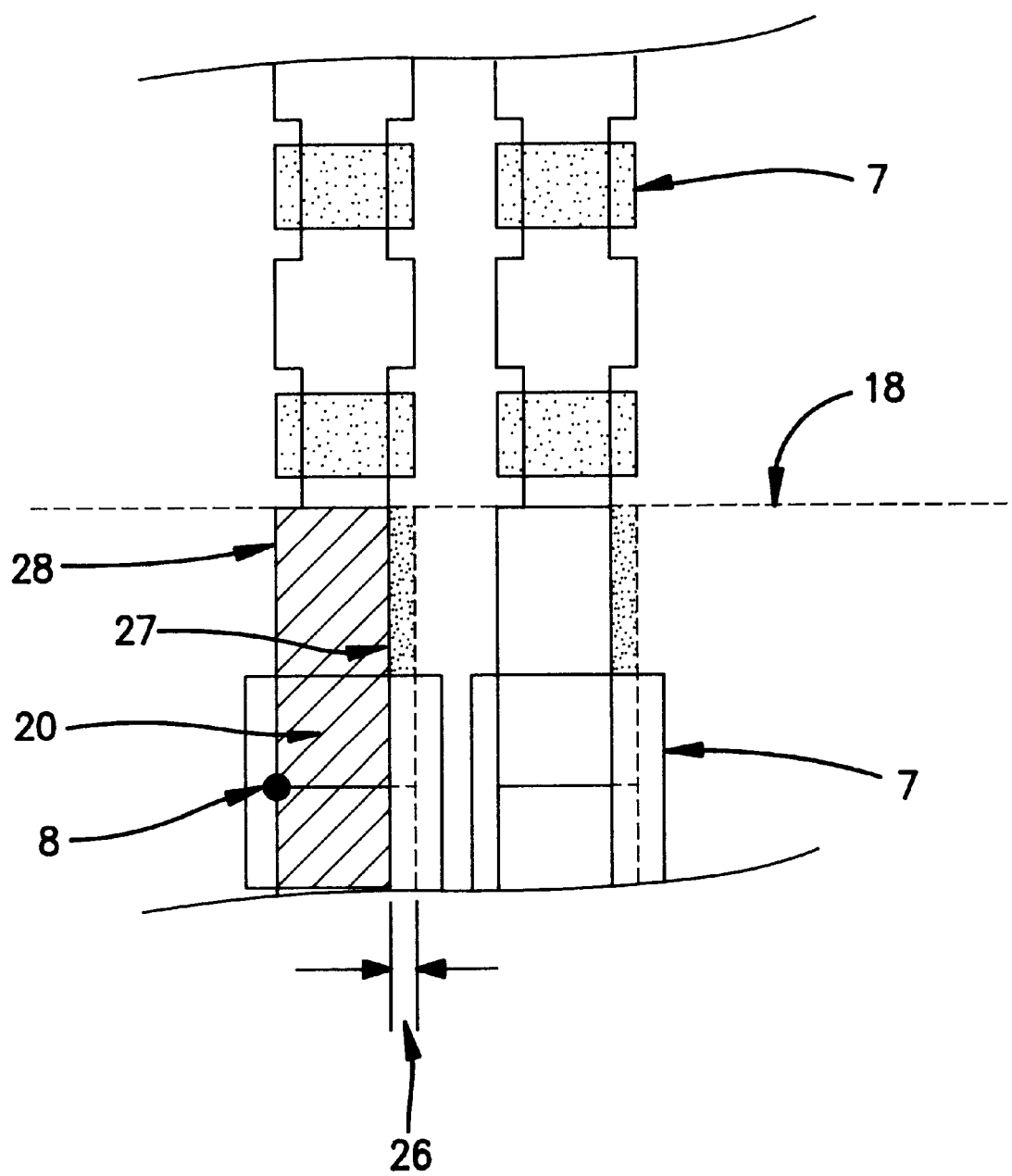
FIG. 5 is a fragmentary enlarged plane view illustrative of the regularly repeated patterns and the random written by the resized variable shaped electron beam.

The present invention provides a method of writing at least a first pattern on a first region of a resist by a variable shaped electron beam exposure. The resist has at least a second region on which at least a second pattern is written by one-shot electron beam exposure. The second region is bounded by a boundary line with the first region so that the fist and second patterns are bounded by the boundary line with each other. The method comprises the steps of: setting a re-size amount; re-sizing a calibrated size of a variable shaped electron beam by a first amount which is smaller than the re-size amount; and shifting an origin for a shot of the variable shaped electron beam by a second amount which is substantially equal to a subtraction of the first amount from the re-size amount before a variable shaped electron beam shot is made.

It is preferable that the re-size amount is determined so as to be equal to a difference in size between the second pattern and an estimated pattern virtually written on the first region by a variable shaped electron beam with a calibrated beam size.

It is also preferable that the first and second amounts are a half of the re-size amount.

It is also preferable that the re-size amount and the first and second amounts are fixed for every variable shaped electron beam shots for writing all of the first patterns.

It is also preferable that the re-size amount and the first and second amounts are varied for every variable shaped electron beam shots for writing all of the first patterns.

The present invention provides a variable shaped electron beam exposure system for writing at least a first pattern on a first region of a resist by a variable shaped electron beam exposure. The resist has at least a second region on which at least a second pattern is written by one-shot electron beam exposure. The second region is bounded by a boundary line with the first region so that the fist and second patterns are bounded by the boundary line with each other. The variable shaped electron beam exposure system further includes: a first element for setting a re-size amount; a second element for re-sizing a calibrated size of a variable shaped electron beam by a first amount which is smaller than the re-size amount; and a third element for shifting an origin for a shot of the variable shaped electron beam by a second amount which is substantially equal to a subtraction of the first amount from the re-size amount before a variable shaped electron beam shot is made.

It is preferable that the re-size amount is determined by the setting means so as to be equal to a difference in size between the second pattern and an estimated pattern virtually written on the first region by a variable shaped electron beam with a calibrated beam size.

It is also preferable that the first and second amounts are a half of the re-size amount.

It is also preferable that the re-size amount and the first and second amounts are fixed for every variable shaped electron beam shots for writing all of the first patterns.

It is also preferable that the re-size amount and the first and second amounts are varied for every variable shaped electron beam shots for writing all of the first patterns.

PREFERRED EMBODIMENTS

Figure 6:
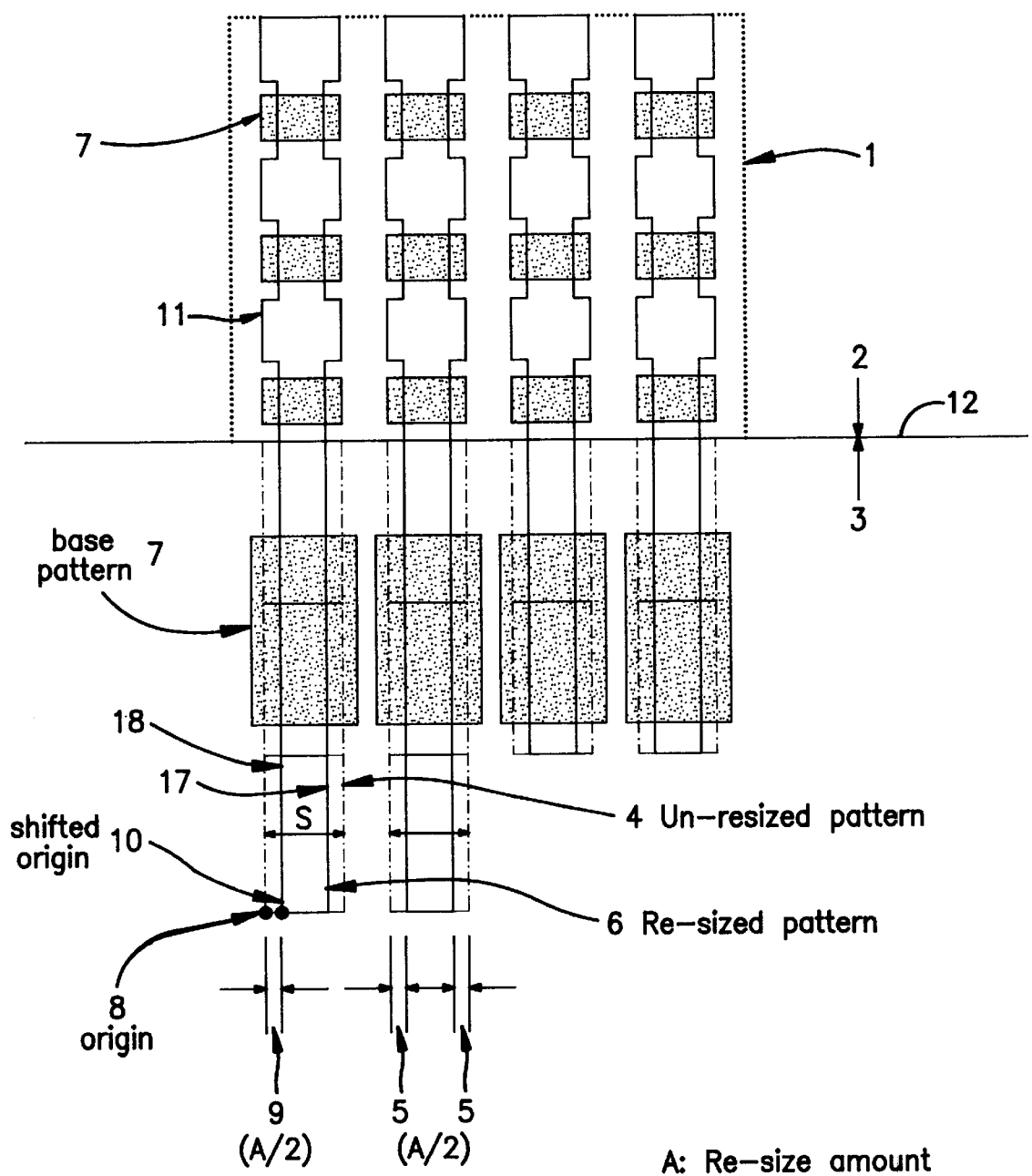
FIG. 6 is a plane view illustrative of regularly repeated patterns written by one-shot electron beam exposure with a mask on a first region and random patterns written by a novel variable shaped electron beam exposure method in a first embodiment in accordance with the present invention.

First Embodiment:

A first embodiment according to the present invention will be described in detail with reference to FIG. 6 which is a plane view illustrative of regularly repeated patterns written by one-shot electron beam exposure with a mask on a first region and random patterns written by a novel variable shaped electron beam exposure method. The resist has a first region 2 and a second region 3 which is bounded by a boundary line 12 from the first region 2. Regularly repeated patterns 11 are written by one-shot electron beam exposure by use of a mask on the first region. Random patterns 4 are written by a variable shaped electron beam exposure on the second region 3. The variable shaped electron beam having been calibrated in size is further re-sized by a novel method as follows. The variable shaped electron beam has a previously calibrated size "S".

Assuming that the variable shaped electron beam free of re-sizing is used to write the random pattern on the resist, then the individual random pattern 4 is different in width from the individual regularly repeated pattern 11. In this case, on the boundary line 12, there is a difference in width between the individual random pattern 4 from the individual regularly repeated pattern 11. A re-size amount "A" is set to be equal to the difference in width between the individual random pattern 4 from the individual regularly repeated pattern 11. In accordance with the present invention, the size-calibrated variable shaped electron beam of the size "S" is further re-sized in a width direction parallel to the boundary line 12 by a half "A/2" of the re-size amount "A" or a re-size width 5 upon adjusting a deflector of the variable shaped electron beam exposure system. Further, an origin 8 of the variable shaped electron beam shot is shifted in the width direction by a shift amount 9 which is equal to a half "A/2" of the re-size amount "A", so that the variable shaped electron beam shot is conducted with reference to a shifted origin 10 for every random patterns to be written by the variable shaped electron beam exposure. As a result, re-sized random patterns 6 is written, which is free of any variation in size or width from the regularly repeated patterns 11 written by the one-shot electron beam exposure by use of the mask. Namely, the individual re-sized random pattern 6 has first and second sides which are respectively aligned to or correspond to the individual regularly repeated pattern 11. The re-sized random pattern 6 has a high accuracy in overlay to a base pattern 7.

Figure 7:
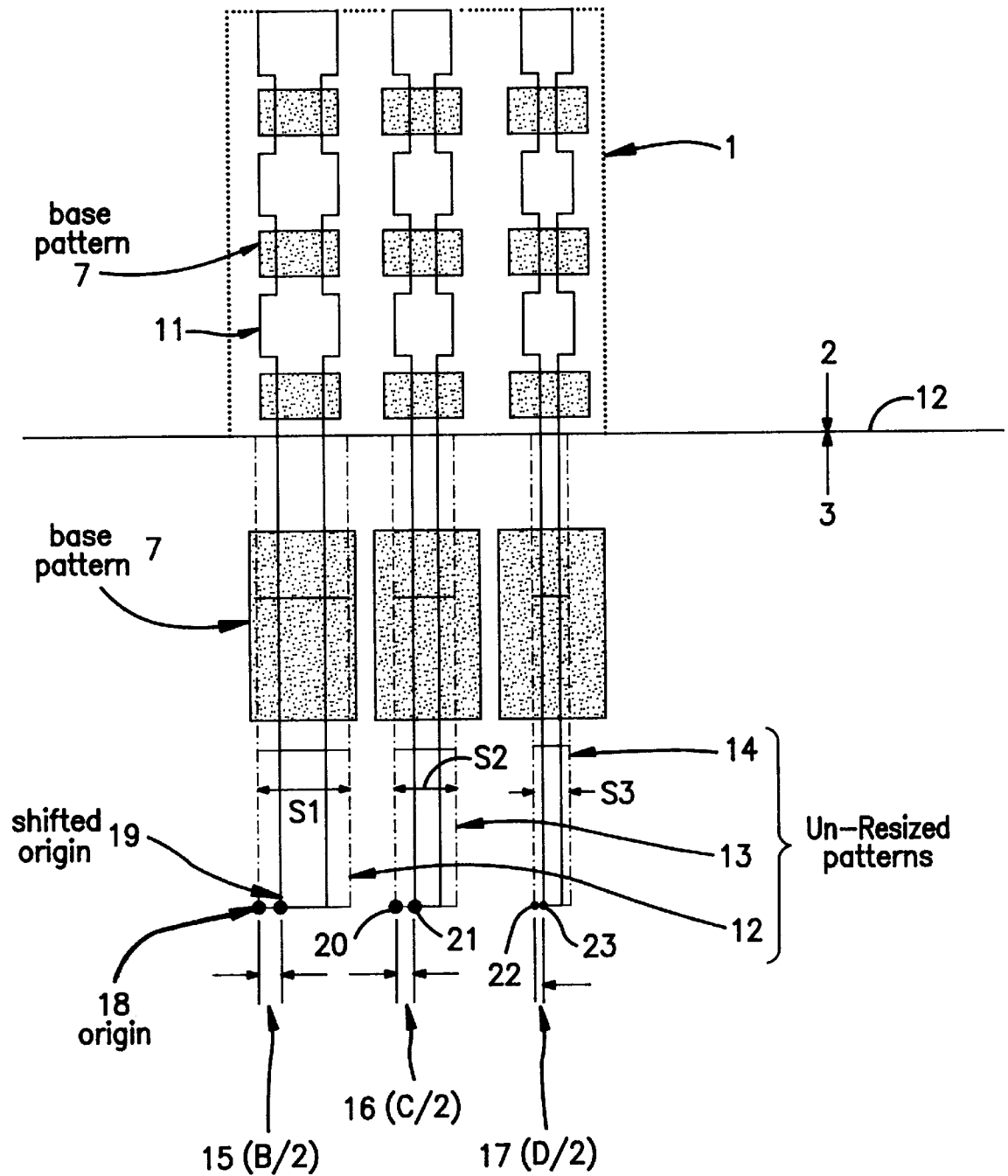
FIG. 7 is a plane view illustrative of regularly repeated patterns written by one-shot electron beam exposure with a mask on a first region and random patterns written by a novel variable shaped electron beam exposure method in a second embodiment in accordance with the present invention.

Second Embodiment:

A second embodiment according to the present invention will be described in detail with reference to FIG. 7 which is a plane view illustrative of regularly repeated patterns written by one-shot electron beam exposure with a mask on a first region and random patterns written by a novel variable shaped electron beam exposure method. The resist has a first region 2 and a second region 3 which is bounded by a boundary line 12 from the first region 2. Regularly repeated patterns 1 are written by one-shot electron beam exposure by use of a mask on the first region. The regularly repeated patterns 1 are different in size or width from each other. Random patterns 4 are written by a variable shaped electron beam exposure on the second region 3. The random patterns 4 are also different in size or width from each other. In this case, the variable shaped electron beams are calibrated in size differently from each other so that the variable shaped electron beams have calibrated sizes different from each other to accord to the different widths or sizes of the regularly repeated patterns. The variable shaped electron beams have previously calibrated sizes "S1", "S2" and "S3" for writing adjacent three random patterns different in size or width. The variable shaped electron beams are further re-sized by a novel method as follows.

Assuming that the variable shaped electron beams free of re-sizing are used to write the adjacent three random patterns on the resist, then the individual random patterns 12, 13 and 14 are different in width from the individual regularly repeated patterns 1. In this case, on the boundary line 12, there are individual differences in width between the random patterns 12, 13 and 14 from the regularly repeated patterns 1. Different re-size amounts "B", "C" and "D" are set to be equal to the individual differences in width between the random patterns 12, 13 and 14 from the regularly repeated patterns 1. In accordance with the present invention, the size-calibrated variable shaped electron beam 12 of the size "S1" is further re-sized in a width direction parallel to the boundary line 12 by a half "B/2" of the re-size amount "B" or a re-size width 15 upon adjusting a deflector of the variable shaped electron beam exposure system The size-calibrated variable shaped electron beam 13 of the size "S2" is also re-sized in the width direction by a half "C/2" of the re-size amount "C" or a re-size width 16 upon adjusting a deflector of the variable shaped electron beam exposure system. The size-calibrated variable shaped electron beam 14 of the size "S3" is also re-sized in the width direction by a half "D/2" of the re-size amount "D" or a re-size width 17 upon adjusting a deflector of the variable shaped electron beam exposure system. Further, a first origin 18 for the shot of the re-sized variable shaped electron beam with the re-size amount of "B" is shifted in the width direction by a first shift amount which is equal to a half "B/2" of the re-size amount "B", so that the re-sized variable shaped electron beam shot is conducted with reference to a shifted first origin 19. A second origin 20 for the shot of the re-sized variable shaped electron beam with the re-size amount of "C" is also shifted in the width direction by a second shift amount which is equal to a half "C/2" of the re-size amount "C", so that the re-sized variable shaped electron beam shot is conducted with reference to a shifted second origin 21. A third origin 22 for the shot of the re-sized variable shaped electron beam with the re-size amount of "D" is also shifted in the width direction by a third shift amount which is equal to a half "D/2" of the re-size amount "D", so that the re-sized variable shaped electron beam shot is conducted with reference to a shifted second origin 23. As a result, re-sized random patterns different in size from each other are written, which are free of any variation in size or width from the respectively paired regularly repeated patterns 1 different in size from each other and having been written by the one-shot electron beam exposure by use of the mask. Namely, each of the re-sized random patterns has first and second sides which are respectively aligned to or correspond to the paired regularly repeated pattern 1. Each of the re-sized random patterns has a high accuracy in overlay to a base pattern 7.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of writing at least a first pattern on a first region of a resist by a variable shaped electron beam exposure, said resist having at least a second region on which at least a second pattern is written by one-shot electron beam exposure, said second region being bounded by a boundary line with said first region so that said fist and second patterns are bounded by said boundary line with each other, said method comprising the steps of:

setting a re-size amount;

re-sizing a calibrated size of a variable shaped electron beam by a first amount which is smaller than said re-size amount; and shifting an origin for a shot of said variable shaped electron beam by a second amount which is substantially equal to a subtraction of said first amount from said re-size amount before a variable shaped electron beam shot is made.

2. The method as claimed in claim 1, wherein said re-size amount is determined so as to be equal to a difference in size between said second pattern and an estimated pattern virtually written on said first region by a variable shaped electron beam with a calibrated beam size.

3. The method as claimed in claim 2, wherein said first and second amounts are a half of said re-size amount.

4. The method as claimed in claim 2, wherein said re-size amount and said first and second amounts are fixed for every variable shaped electron beam shots for writing all of said first patterns.

5. The method as claimed in claim 2, wherein said re-size amount and said first and second amounts are varied for every variable shaped electron beam shots for writing all of said first patterns.

6. A variable shaped electron beam exposure system for writing at least a first pattern on a first region of a resist by a variable shaped electron beam exposure, said resist having at least a second region on which at least a second pattern is written by one-shot electron beam exposure, said second region being bounded by a boundary line with said first region so that said fist and second patterns are bounded by said boundary line with each other, wherein said variable shaped electron beam exposure system further including:

means for setting a re-size amount;

means for re-sizing a calibrated size of a variable shaped electron beam by a first amount which is smaller than said re-size amount; and means for shifting an origin for a shot of said variable shaped electron beam by a second amount which is substantially equal to a subtraction of said first amount from said re-size amount before a variable shaped electron beam shot is made.

7. The variable shaped electron beam exposure system as claimed in claim 6, wherein said re-size amount is determined by said setting means so as to be equal to a difference in size between said second pattern and an estimated pattern virtually written on said first region by a variable shaped electron beam with a calibrated beam size.

8. The variable shaped electron beam exposure system as claimed in claim 7, wherein said first and second amounts are a half of said re-size amount.

9. The variable shaped electron beam exposure system as claimed in claim 7, wherein said re-size amount and said first and second amounts are fixed for every variable shaped electron beam shots for writing all of said first patterns.

10. The variable shaped electron beam exposure system as claimed in claim 7, wherein said re-size amount and said first and second amounts are varied for every variable shaped electron beam shots for writing all of said first patterns.

* * * * *